United States Patent

Halvarsson

Patent Number: 6,062,501
Date of Patent: May 16, 2000

[54] YARN FEEDER HAVING A PROXIMITY SENSOR

[75] Inventor: Bjoern Halvarsson, Ulricehamn, Sweden

[73] Assignee: IRO AB, Ulricehamn, Sweden

[21] Appl. No.: 09/142,808

[22] PCT Filed: Mar. 25, 1997

[86] PCT No.: PCT/EP97/01521

§ 371 Date: Sep. 11, 1998

§ 102(e) Date: Sep. 11, 1998

[87] PCT Pub. No.: WO97/35793

PCT Pub. Date: Oct. 2, 1997

[30] Foreign Application Priority Data

Mar. 26, 1996 [DE] Germany ............................ 196 11 998
Jul. 19, 1996 [DE] Germany ........................ 296 12 566 U

[51] Int. Cl.[7] ................................................ B65H 51/20
[52] U.S. Cl. .................................... 242/364.8; 242/364.7; 242/365.3; 139/452
[58] Field of Search ............................ 242/364.8, 364.7, 242/364.6, 365.3; 139/452

[56] References Cited

U.S. PATENT DOCUMENTS

| 4,213,110 | 7/1980 | Holce . | |
|---|---|---|---|
| 4,632,155 | 12/1986 | Maina | 139/452 |
| 4,676,442 | 6/1987 | Tholander et al. . | |
| 4,715,411 | 12/1987 | Van Bogaert et al. | 139/452 |
| 4,811,762 | 3/1989 | Bucher et al. | 139/452 |
| 5,119,998 | 6/1992 | Tholander et al. | 242/364.8 |
| 5,172,052 | 12/1992 | Wells . | |
| 5,211,347 | 5/1993 | Riva | 242/364.7 |
| 5,285,822 | 2/1994 | Josefsson et al. . | |
| 5,613,528 | 3/1997 | Zenoni et al. | 139/452 |

FOREIGN PATENT DOCUMENTS

| 0 171 516 A2 | 2/1986 | European Pat. Off. . |
|---|---|---|
| 39 11 411 A1 | 10/1990 | Germany . |

*Primary Examiner*—Donald P. Walsh
*Assistant Examiner*—Minh-Chau Pham
*Attorney, Agent, or Firm*—Flynn, Thiel, Boutell & Tanis, P.C.

[57] ABSTRACT

A proximity sensor H with a feeler element 16, 17 which is provided in a holder 22 and is directed towards the motion range of a magnet 28 which is movable in relation to Hall element 16 and can be caused to respond to said magnet 28 has at least one metal trimming body T, 27 in the vicinity of the sensor element such that said trimming body can be adjusted in its distance from said sensor element. The response sensitivity of said proximity sensor H can be varied by a distance adjustment of said trimming body. The proximity sensor H equipped with said trimming body T. 27 suitably is provide in a yarn feeder as a yarn sensor G or a speed- or counting sensor D and is adjustable with respect to its response sensitivity by means of said trimming body.

13 Claims, 1 Drawing Sheet

YARN FEEDER HAVING A PROXIMITY SENSOR

FIELD OF THE INVENTION

The invention relates to a yarn feeder having a sensor element that detects motion of a magnet to control the yarn feeder.

BACKGROUND OF THE RELATED ART

In the yarn processing technique proximity sensors are extensively used for yarn detection or motion detection. EP-B-171 516 relates to a yarn feeder in which several proximity sensors scan the size of a yarn store built on the storage drum (minimum-, maximum- or reference-store size sensor) for controlling the drive motor of a winding on element. In this case the magnet, e.g. a permanent magnet, causing a Hall element of the proximity sensor to respond, is moved by the yarn store from a first position in which the magnet is closer to the Hall element and a second position in which it is further distant from said Hall element. The Hall element then is responding to said motion digitally or analogously. The proximity sensor generates a signal which controls the drive motor (to switch it on or off, to accelerate or decelerate it). Frequently in such a yarn feeder furthermore a proximity sensor is provided as a speed- or counting sensor responding to the passage of a magnet rotating with the drive shaft or the winding on element, respectively, by a signal. Such proximity sensors are extraordinarily reliable electronic components. For cost reasons in almost all cases a Hall element can be used, but also a magneto-resistive sensor element or an inductive sensor element, in order to gain signals from the relative motion of a body made from magnetic and/or electromagnetic flux conducting material. It has shown in practice that in a production series of yarn feeders or among the several proximity sensors in one and the same yarn feeder the response sensitivity of the proximity sensors does fluctuate. Supposedly this is due to the properties of the proximity sensors and occasionally also to manufacturing or assembly tolerances. For example, in one proximity sensor used as a maximum store size sensor the switching point is situated at another distance between the Hall element and the magnet than at the same maximum store size sensor of a further yarn feeder of the same production series. This even can occur among the proximity sensors in one and the same yarn feeder. It is desirable to achieve among the proximity sensors in one and the same yarn feeder the same response behavior, or to guarantee among equal proximity sensors in different yarn feeders of a production series the same response behavior such that motor control is carried out identically. When using proximity sensors having a Hall element it is generally known in practice to improve the response of said Hall element by means of a metal body secured in the vicinity of said Hall element to concentrate the magnetic flux.

A Reed switching device for a safety monitoring system or a machine control system is known from U.S. Pat. No. 4,213,110 according to which a preloading solenoid is associated to an encapsulated Reed switch. The preloading solenoid can be shifted parallel to the longitudinal direction of said Reed switch in order to change the sensitivity of said Reed switch.

From U.S. Pat. No. 5,172,052 a current sensor is known for scanning contactlessly the current flowing in conductors. Between the conductors of a pair of conductors a Hall element is provided having the shape of a flat square prism. In order to concentrate or direct the magnetic flux an adjustment screw is associated to said Hall element. By adjusting the adjustment screw in its longitudinal direction the flux density can be increased or decreased in the Hall element in order to adjust the sensitivity of the current sensor.

SUMMARY OF THE INVENTION

It is a task for the invention to create a yarn feeder in which in structurally simple fashion the response behavior of the proximity sensor can be varied or equal response behaviors of the proximity sensors within a yarn feeder production series can be achieved.

Said task can be achieved according to the invention by providing a movable trimming body.

By varying the distance between the trimming body and the sensor element at the yarn feeder the response sensitivity of the respective sensor element can be varied or the switching point can be adjusted to a determined distance between the sensor element and the magnet or the iron body, respectively. In case that there is a fluctuation among the proximity sensors within a series of yarn feeders said fluctuation can be leveled later. Within one production series or even in one yarn feeder identical response relationships among the proximity sensors can be achieved. The response behaviors even can be adapted later by means of the trimming body to determined relations, in case that this is suitable for the particular case of application. Of advantage is that a variation of the response sensitivity can be made at any time, i.e. also later, even with an already functional installed yarn sensor, or a speed- or counting sensor. The trimming body should have a material, e.g. metal, conducting magnetic or electromagnetic flux. The sensor element can be a Hall element or a magneto-resistive or inductive sensor element. By means of the signals of the yarn sensor the drive motor of the yarn feeder is controlled. By means of the adjustment of the trimming body yarn sensors within a production series of yarn feeders or in one and the same yarn feeder can be matched later in order to achieve identical control relationships with the proximity sensors or for the drive motors of the yarn feeders of the production series. Within a production series of yarn feeders, identical response behaviors can be adjusted later by means of the trimming bodies in case of fluctuating speed- or counting sensors or fluctuations in the response behavior of the sensors can be eliminated later, e.g. as caused by earlier manufacturing- and assembly tolerances.

The handling wherein the trimming body is a screw is suitable since the sensor can be comfortably trimmed at any time.

In a further variation, a screw is functioning as a carrier of the trimming body.

Also, the trimming body can be moved in relation to the sensor element like a bayonet closure connection, in an excenter-adjustment mechanism or the like. This means that the trimming element is not necessarily a screw in a threaded bore but also can be a simple metal body having an engagement element which can be adjusted in relation to said sensor element. Furthermore, it is possible to use a threaded spindle or a screw only as a drive for the trimming body which then is separated therefrom and is guided in a movable fashion and is in engagement therewith.

The embodiment wherein the sensor element is provided in a holder at the mouth of a threaded bore is compact and saves mounting space. The threaded bore has a dual function, since it is also used for positioning the sensor element.

Suitably the trimming body is seated in holder made of "neutral material", e.g. plastic. Its adjustment is carried out with a tool which at least at its engaging tool tip consists of "neutral material", in order to not falsify the result of the adjustment.

BRIEF DESCRIPTION OF THE DRAWINGS

Embodiments of the invention will be described with the help of the drawings. In the drawings.

DETAILED DESCRIPTION

Figure 1:
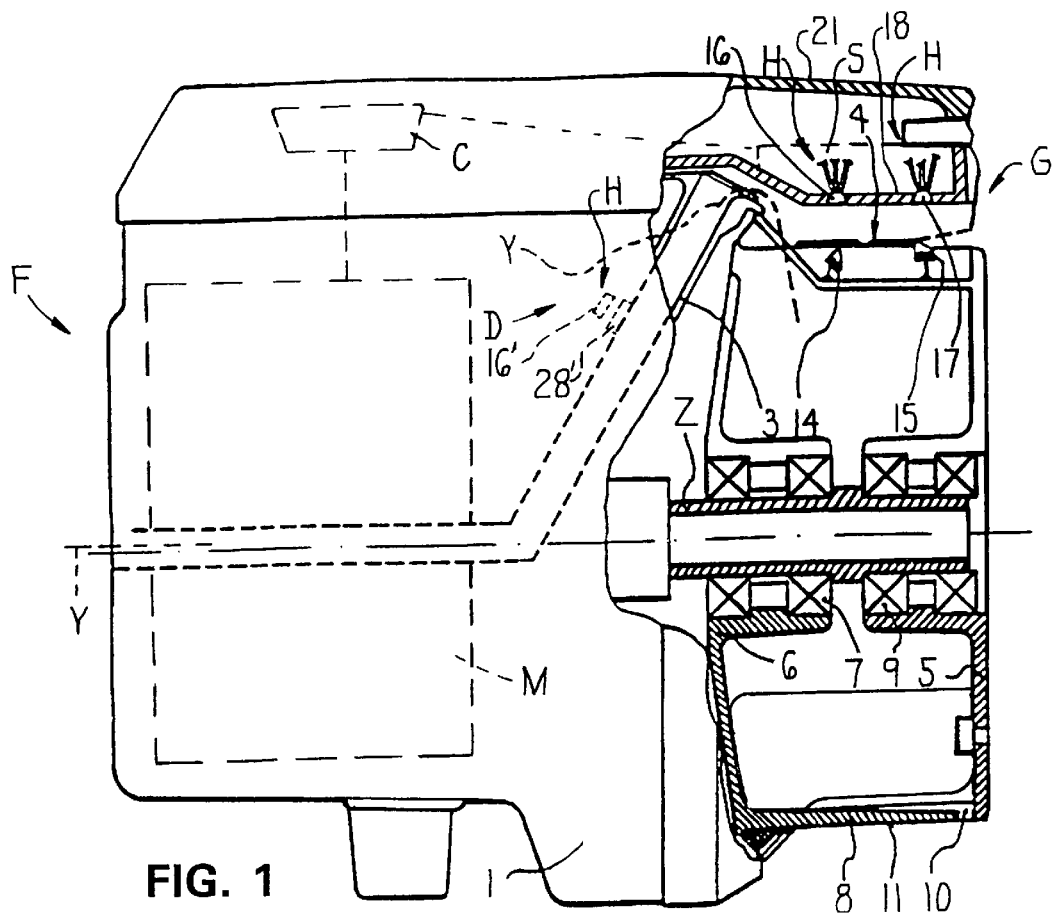
FIG. 1 a schematic side view, partially in form of a sectional view, of a yarn feeder having proximity sensors, e.g. with Hall elements, and FIG. 2 a partial section of FIG. 1 showing components of one proximity sensor in detail.

A yarn feeder F in FIG. 1 includes a housing 1 in which a drive shaft 2 is supported rotatably and is drivable by means of a drive motor M for rotation. Said drive shaft 2 carries a yarn winding on element 3 extending obliquely outwardly. The yarn Y entering housing 1 in FIG. 1 from the left side penetrates winding on element 3 and by its rotation is wound onto the surface 11 of a storage drum 5 in adjacent windings and into a yarn store 4. Storage drum 5 is supported rotatably on drive shaft 2 and is hindered against a co-rotation by not shown means (stationary storage drum). A yarn feeder of another kind (not shown) instead could be operated with a storage drum rotating with drive shaft 2 but a stationary winding on element 3.

The surface 11 of storage drum 5 in this embodiment is defined by axial and interengaging rods 10, 8. Rods 8 are provided at a hub 6 which is rotatably provided on drive shaft 2 by means of bearings 7 and with an inclination and an eccentricity. To the contrary, rods 10 are provided at a hub which is coaxially supported by bearings 9 on drive shaft 2. Thanks to the inclination and eccentricity said rods 8 carry out a periodic wobbling motion relative to rod 10 when the drive shaft 2 is rotating. By said wobbling motion the yarn windings on the storage drum are conveyed in FIG. 1 towards the right side and are separated from another.

Associated to winding on element 3 can be provided a speed- or counting sensor D having a sensor element 16' which is oriented to magnet 28' provided at winding on element 3 such that with each passage of said winding on element a signal is generated.

Furthermore, in a bracket 21 of housing 1 yarn sensors G are provided which include two proximity sensors H with sensor elements 16 and 17 and associated feeler elements 14, 15, e.g. Hall sensors having Hall elements. Said proximity sensors H are integrated into a sensor circuit S which is connected to a control device C for controlling drive motor M. Each feeler element 15, 14 is movable by said yarn store 4 from a position in which it e.g. projects beyond surface 11 of storage drum 5 (shown by feeler element 15) in a position closer to the axis of storage drum 5. The associated proximity sensor H or its sensor element 16, respectively 17, responds to this motion in order to generate control signals for control device C. In FIG. 1 yarn store 4 is just reaching feeler element 15 which not yet has been displaced inwardly. The minimum size of the yarn store is monitored by feeler element 14 which is cleared in case of a corresponding size reduction of the yarn store due to consumption and then approaches towards sensor element 16 what consequently generates a signal with which the drive motor M either becomes accelerated or switched on. With an inward displacement of feeler element 15 by the yarn to the contrary the drive motor M becomes stalled or decelerated. The sensor elements 16, 17 are provided in a cover 18 or scarcely behind. Due to fluctuation or/and production- and assembly tolerances within a production series of yarn feeders or among proximity sensor in one and the same yarn feeder the distances between the feeler element 14 or 15 and its sensor element 16 or 17 can vary at which the respective switching point of the proximity sensor (digital switching) is reached. As a result, within the production series or among the proximity sensors undesirable differences when controlling of the drive motors M will exist. In order to eliminate said differences (FIG. 2) at each sensor element 16 a trimming body T is provided such that it can be adjusted with respect to its distance from sensor element 16. Trimming body T consists, at least to a dominant part, from material conducting magnetic or electromagnetic flux, e.g. from metal, and is influencing the response behavior of sensor element 16. By means of a distance adjustment of the trimming body in relation to sensor element 16 the response behavior of sensor element 16 can be varied such that the above-mentioned fluctuation of the proximity sensors can be eliminated by trimming with the help of trimming bodies T. Alternatively, the switching point of the proximity sensor can be displaced by means of the trimming body T upon demand and/or intentionally.

In very many cases the sensor element 16,17 is a Hall element responding to a change of the density of the actuating magnetic field. Instead also a magneto-resistive or inductive sensor element can be used, i.e. every sensor element, which is capable to output an electric signal depending on the distance of a body of magnetic and/or electro-magnetic flux conducting material.

Figure 2:
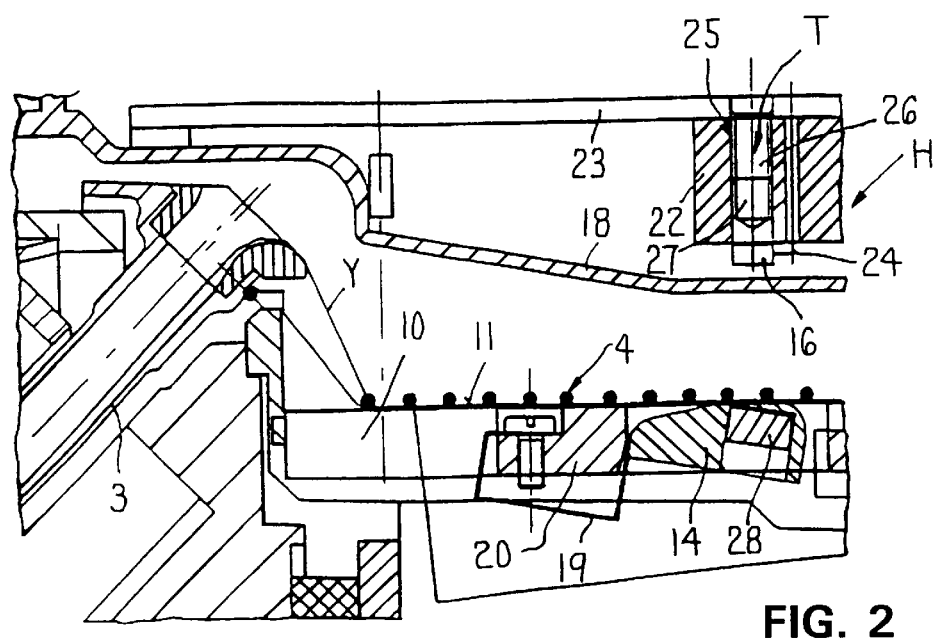

In FIG. 2 a holder 22 for said sensor element 16, e.g. a Hall element of a Hall sensor H, is provided at a plate 23. The holder 22 includes a threaded bore 25 receiving a screw 26 of metal serving as trimming body T. Suitably said screw 26 is seated in "neutral" material with regard to the response behavior of sensor element 16, e.g. plastics. Adjustments are carried out with the help of a tool of "neutral" material as well. The sensor element 16 is provided at the mouth of threaded bore 25 and is reacting in its response behavior to the proximity of trimming body T. Occasionally, screw 26 only functions as carrier and drive of a metal mass 27. By turning screw 26 in threaded bore 25 which is oriented with its axis to sensor element 16 the distance between trimming body T and sensor element 16 can be varied. The signals generated are transmitted via a line 24 to a sensor circuit such as the sensor circuit S (FIG. 1). The cover 18 in this case is located with a distance in front of sensor element 16.

Said fuler element 14 contains a magnet 28, e.g. a permanent magnet, the magnetic field of which causes sensor element 16 to respond. Fuler element 14 is attached to a spring arm 19 which is supported at a location 20 in one of rods 10 of storage drum 5. The yarn windings in yarn store 4 with the shown size are displacing feeler element 14 downwardly such that sensor element 16 then is immersed more weakly by the magnetic field of magnet 28. In case that, otherwise, the size of yarn store 4 is reduced that far that fuler element 14 becomes free, spring arm 19 will push fuler element 14 with its magnet 28 upwardly until sensor element 16 responds to the increasing intensity of the magnetic field of magnet 28, will then exceed the switching point and cause a signal. By screwing said trimming body T the response sensitivity can be varied.

Trimming body T instead could be adjustable in its distance from sensor element 16 like in a bayonet engagement. Furthermore, it is possible to provide a guided metallic ball or metallic nut on a screw or threaded spindle and to move it by rotation of said screw or threaded spindle, which itself is not movable in axial direction, closer to sensor element 16 or further away form it. Also adjustments caused by a lever or an excenter would be possible for trimming body T.

By means of adjusting the trimming body relative to the sensor element the response behavior of the sensor element is varied in a simple way, suitably for the purpose, to eliminate a fluctuation of the response sensitivity of the proximity sensor even later, in order to achieve within a production series in one or in several yarn feeders an identical response behavior of the proximity sensors and equal control prerequisites.

This also is true for the speed- or counting sensor D in FIG. 1, the sensor element 16 of which is cooperating with an adjustable trimming body T (not shown).

The proximity sensors H, particularly when being Hall sensors, can operate digitally or analogously.

I claim:

1. In a yarn feeder comprising a housing including a drive shaft, a winding on element which is rotatable by means of said drive shaft, a storage drum provided at said drive shaft on which yarn is wound in a yarn store by said winding on element, and at least one proximity sensor which includes a sensor element, said sensor element being directed towards a motion area of a flux conducting body of magnetic or electromagnetic flux conducting material, said flux conducting body being movable in said motion area in relation to said sensor element which responds to the motion of said flux conducting body, comprising the improvement wherein said sensor element is directed towards said flux conducting body and said proximity sensor defines either a yarn sensor for detecting the size of said yarn store wherein said yarn sensor varies in dependence on consumption of said yarn which is removed from said yarn store, said flux conducting body being provided in said storage drum so as to be movable by said yarn store relative to said sensor element and said yarn sensor being mounted stationarily outside said storage drum, or a speed- or counting sensor which is provided in said housing wherein said flux conducting body rotates with said drive shaft or said winding on element, said proximity sensor further including at least one trimming body of magnetic or electromagnetic flux conducting material which is disposed a relative distance from said sensor element, said relative distance being adjustable wherein adjustment of said relative distance varies the response sensitivity of said respective sensor element.

2. The yarn feeder according to claim 1, wherein said trimming body is a metal material.

3. The yarn feeder according to claim 1, wherein said trimming body is a screw directed towards said sensor element, said screw being accessible from an exterior of said yarn feeder.

4. The yarn feeder according to claim 1, wherein said trimming body is provided on a screw which is screwable in a threaded bore.

5. The yarn feeder according to claim 4, wherein said sensor element is provided in a holder at a mouth of said threaded bore in which said trimming body screw is received.

6. The yarn feeder according to claim 1, wherein a rotation socket is provided and said trimming body includes at least one engagement element which fits rotatably into said rotational socket, said relative distance of said trimming body from said sensor element being adjusted by rotating said trimming body or said rotation socket.

7. The yarn feeder according to claim 1, wherein said sensor element is a Hall element or a magneto-resistive or inductive sensor element.

8. The yarn feeder according to claim 1, wherein said flux conducting body is a magnet.

9. In a yarn feeder comprising a housing including a drive shaft, a winding on element which is rotatable by means of said drive shaft, a storage drum provided at said drive shaft on which yarn is wound in a yarn store by said winding on element, and at least one proximity sensor which includes a sensor element and a flux conducting body which generates a magnetic field during operation of said yarn feeder, said sensor element being directed toward said flux conducting body and said flux conducting body being movable in a motion area relative to said sensor element such that said sensor element responds to the motion of said flux conducting body, comprising the improvement wherein said proximity sensor includes at least one trimming body of magnetic or electromagnetic flux conducting material which is disposed a relative distance from said sensor element, said trimming body being movable to adjust said relative distance wherein adjustment of said relative distance varies the response sensitivity of said respective sensor element for eliminating fluctuations between said proximity sensor and other proximity sensors, said sensor element being supported on said housing so as to detect said magnetic field and detect changes therein during movement of said flux conducting body, said flux conducting body either being movably mounted on said storage drum so as to be moved by said yarn store wherein said proximity sensor defines a yarn sensor or rotating with said drive shaft or said winding on element wherein said proximity sensor defines a speed or counting sensor.

10. The yarn feeder according to claim 9, wherein a plurality of said proximity sensors are provided, said trimming bodies of said proximity sensors being adjusted to eliminate fluctuations between said proximity sensors.

11. The yarn feeder according to claim 9, wherein said flux conducting body is a permanent magnet.

12. The yarn feeder according to claim 11 wherein movement of said flux conducting body varies an intensity of said magnetic field at said sensor element.

13. The yarn feeder according to claim 9, wherein said trimming body is movable toward and away from said sensor element.

* * * * *